(12) United States Patent
Kothandaraman et al.

(10) Patent No.: US 7,075,127 B2
(45) Date of Patent: Jul. 11, 2006

(54) SINGLE-POLY 2-TRANSISTOR BASED FUSE ELEMENT

(75) Inventors: Chandrasekharan Kothandaraman, Wappingers Falls, NY (US); Danny Shum, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/769,101

(22) Filed: Jan. 29, 2004

(65) Prior Publication Data

US 2005/0167728 A1 Aug. 4, 2005

(51) Int. Cl.
*H01L 27/105* (2006.01)
(52) U.S. Cl. ............... 257/209; 257/315; 257/316; 438/257; 438/281; 438/601
(58) Field of Classification Search ............... 257/209, 257/315, 316, 318, 322, 529, E23.149, E21.592, 257/E27.103; 438/211, 257–258, 215, 281, 438/467, 601
See application file for complete search history.

(56) References Cited

U.S. PATENT DOCUMENTS

| | | | |
|---|---|---|---|
| 4,035,820 A * | 7/1977 | Matzen | 257/318 |
| 4,361,847 A | 11/1982 | Harari | |
| 4,459,608 A | 7/1984 | Giebel et al. | |
| 4,845,538 A | 7/1989 | Hazani | |
| 5,029,130 A | 7/1991 | Yeh | 365/185 |
| 5,247,346 A | 9/1993 | Hazani | |
| 5,436,479 A | 7/1995 | Devin | |
| 5,440,159 A * | 8/1995 | Larsen et al. | 257/318 |
| 5,633,186 A | 5/1997 | Shum et al. | 438/264 |
| 5,835,409 A | 11/1998 | Lambertson | |
| 5,844,271 A | 12/1998 | Sethi et al. | 257/318 |
| 5,856,223 A | 1/1999 | Wang | 438/264 |
| 5,872,732 A * | 2/1999 | Wong | 365/185.18 |
| 5,886,378 A * | 3/1999 | Wang | 257/318 |
| 5,986,941 A | 11/1999 | Pang et al. | 365/185.33 |
| 6,100,746 A * | 8/2000 | Wu | 327/525 |
| 6,177,703 B1 * | 1/2001 | Cunningham | 257/321 |
| 6,313,500 B1 * | 11/2001 | Kelley et al. | 257/316 |
| 6,392,468 B1 | 5/2002 | Wu | |
| 6,573,557 B1 * | 6/2003 | Watanabe | 257/318 |

(Continued)

FOREIGN PATENT DOCUMENTS

EP 0 847 091 A2 6/1998

(Continued)

OTHER PUBLICATIONS

Internationl Search Report, International Application No. PCT/EP2004/053138; Apr. 18, 2005, 4 pages.

*Primary Examiner*—Allan R. Wilson
(74) *Attorney, Agent, or Firm*—Brinks Hofer Gilson & Lione

(57) ABSTRACT

An electrically programmable transistor fuse having a double-gate arrangement disposed in a single layer of poly-silicon in which a first gate is disposed overlapping a portion of a source region and a second gate is insulated from the first gate and disposed overlapping a portion of a drain region. The first gate includes a terminal for receiving an externally applied control signal and the second gate is capacitively couple to the drain region in which a coupling device is included for increasing the capacitive coupling of the second gate and the drain region for enabling reduction in fuse programming voltage.

20 Claims, 7 Drawing Sheets

U.S. PATENT DOCUMENTS

| | | | |
|---|---|---|---|
| 6,617,637 B1 * | 9/2003 | Hsu et al. | 257/315 |
| 6,627,947 B1 * | 9/2003 | Hu et al. | 257/318 |
| 6,653,183 B1 * | 11/2003 | Hung et al. | 438/211 |
| 6,653,682 B1 | 11/2003 | Houdt et al. | |
| 6,690,057 B1 * | 2/2004 | Frerichs | 257/315 |
| 6,822,286 B1 * | 11/2004 | Hsu et al. | 257/315 |
| 6,842,374 B1 * | 1/2005 | Lee et al. | 365/185.18 |
| 2003/0119258 A1 * | 6/2003 | Pascucci | 438/257 |

FOREIGN PATENT DOCUMENTS

| | | |
|---|---|---|
| EP | 1 096 572 A1 | 5/2001 |
| GB | 2 165 410 A | 4/1986 |

* cited by examiner

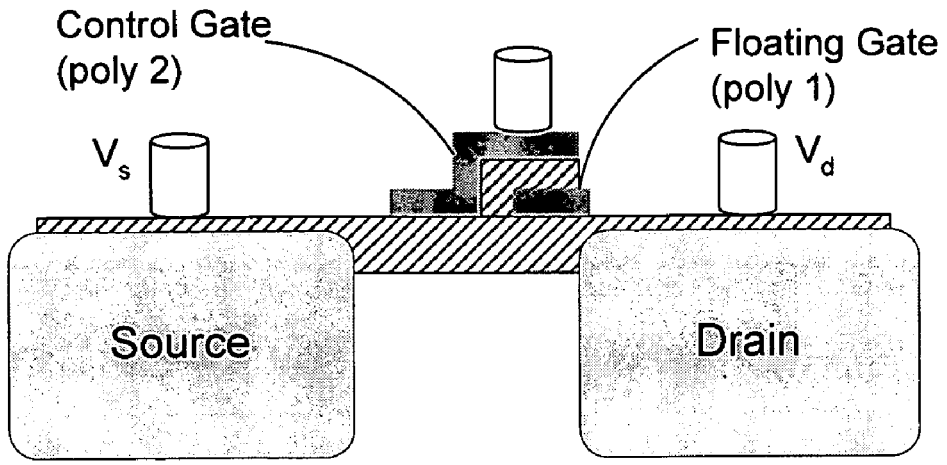
PRIOR ART
Figure 1
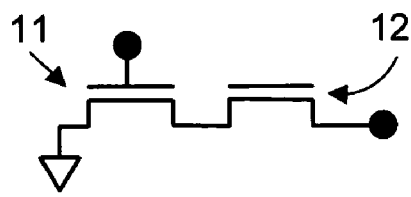
PRIOR ART
Figure 1A
| SG EE | Erase | Program | Read |
|---|---|---|---|
| SG Wordline (WL) | -17 V (-12 V) | Vt | Vref |
| Bitline (BL) | Vss (5V) | 12 V | Vdd |
| Source Line (SR) | Vss | Vss | Vss |
PRIOR ART
Figure 1B

| NVM Fuse | Erase | Program | Read |
|---|---|---|---|
| Selected Wordline | -5 V | Vt | Vref |
| (BL) (+ iso-well | 5 V | 5 V | Vdd |
| Source | Vss | Vss | Vss |

| NVM fuse | Erase | Program | Read |
|---|---|---|---|
| Select (WL) | -5 V | Vt | Vref |
| Latch BL (Prog FET) | 5V | 5 V (on) | Vdd (off) |
| Source | Vss | Vss | Vss |

# SINGLE-POLY 2-TRANSISTOR BASED FUSE ELEMENT

BACKGROUND OF THE INVENTION

1. Technical Field of the Invention

The invention relates generally to the field of integrated circuit and, more particularly, to fusible link programming in semiconductor integrated circuits.

2. Description of Related Art

In integrated circuits including CMOS integrated circuits, it is often desirable to be able to permanently store information, or to form permanent connections of the integrated circuit after it is manufactured. Fuse or anti-fuse devices forming fusible links are frequently used for this purpose. Fuses and anti-fuses can also be used to program redundant elements to replace identical defective elements such as DRAM, Flash EEPROM, SRAM, or other memories. Further, fuses can be used to store die identification or other such information, or to adjust the speed of a circuit by adjusting the resistance of the current path.

One type of fuse device is "programmed" or "blown" using a laser to open a link after a semiconductor device is processed and passivated. This type of fuse device requires precise alignment of the laser on the fuse device to avoid destroying neighboring devices. This and other similar approaches can result in damage to the device passivation layer, and thus, lead to reliability concerns. For example, the process of programming the fuse can cause a hole in the passivation layer when the fuse material is displaced. Also the method is not in-system, sometimes inconvenient, and thus lead to higher test cost.

Another type of fuse device is the electrical fuse/anti-fuse. Electrical fuse/anti-fuses have been introduced into semiconductor products and are, in many applications, replacing the commonly used laser fuses. The typical electrical fuse/anti-fuse is in-system but is one-time programmable. It is generally a passive element such as resistor or capacitor which is programmed or blown using electrical pulses via a programming (pass gate) transistor. Since significant energy or high programming current is required to pass through these devices to reach the passive element, the size required for the programming (pass gate) transistors can be very large.

For example, a currently used anti-fuse device is structured based on a conventional MOS transistor. Such an anti-fuse is programmed by applying a voltage (generally about 7 Volts) across the gate-oxide of the MOS transistor. The programming process results in a damaged gate-oxide which reduces the electrical resistance across the oxide. A sensing circuit attached to the anti-fuse is used to differentiate between the high resistance of the intact oxide and the lowered resistance of the damaged oxide. For lower resistances and more reliable sensing, even higher programming voltages and programming currents are used.

Because of the significant energy required for programming, damage can result to surrounding structure and/or unreliable sensing can result because of the inconsistent nature of the blow process and the relatively small change typically offered in the programmed resistance. Further, these type of devices may not be viable for use with many of the latest process technologies because of the required programming potentials, i.e. high current flow and high voltage levels over a requisite amount of time. It would be advantageous to lower the programming parameters in order to enable reduction of the size of the associated circuits (e.g. voltage generator, programming transistor, wiring, etc.) and/or improve the sensing reliability.

SUMMARY OF THE INVENTION

The present invention achieves technical advantages as an electrically programmable transistor fuse having a source and drain disposed in a semiconductor substrate and further having a double-gate arrangement disposed in a single layer of polysilicon in which one gate is capacitively coupled to the drain region. The transistor further includes a coupling device adapted to increase the capacitive coupling of the one gate and the drain region for enabling reduction in fuse programming voltage, wherein programming of the transistor fuse is effectuated via application of a voltage signal to the drain in which the voltage signal is less than the junction breakdown of the transistor fuse.

BRIEF DESCRIPTION OF THE DRAWINGS

For a more complete understanding of the present invention, reference is made to the following detailed description taken in conjunction with the accompanying drawings wherein:

FIG. 1 illustrates a conventional EEPROM device;

FIG. 1A illustrates an circuit equivalent of a series-connected isolation transistor and a floating gate transistor;

FIG. 1B shows operating bias for a conventional structure of FIG. 1.

DETAILED DESCRIPTION

Figure 2A:
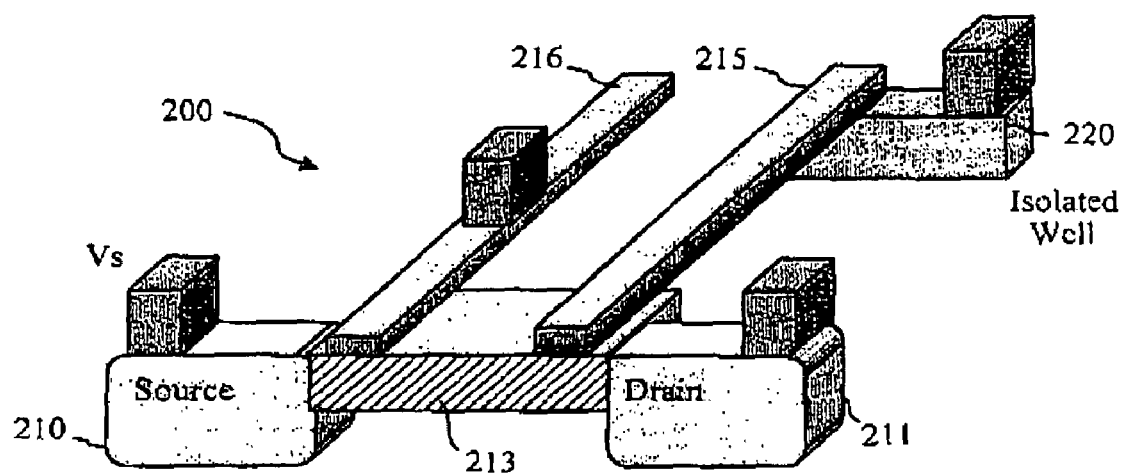
FIGS. 2A illustrates a 2-transistor structure for use as an electrical fuse element in accordance with exemplary embodiments of the present invention.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed Descriptions of known functions and constructions unnecessarily obscuring the subject matter of the present invention have been omitted for clarity.

Current electrical fuses are passive elements, such as resistors or capacitors, which are programmed by electrical pulses with typical programming currents in the order of milli-amp (mA) or transistor fuses having programming voltage greater than the junction breakdown of the transistor. In accordance with exemplary embodiments of the present invention, a single polysilicon 2-transistor EEPROM type transistor advantageously realized in a self-aligned CMOS process is described and used as a fuse element. The programming current required to program a 2-transistor EEPROM type device is in the order of few micro-amp (µA), a three order of magnitude reduction over typical electric type fuses. However, conventional EEPROM devices are not CMOS compatible and have high programming potentials.

Conventional split-gate EEPROM structures are formed using at least two layers of polycrystalline silicon and include a floating gate transistor as shown in FIG. 1. This memory cell configuration is equivalent to a series connected isolation transistor 11 and floating gate transistor 12 as illustrated in the circuit diagram of FIG. 1A. The isolation transistor 11 is not influenced by the state of the floating gate and will remain off when its control gate is not activated. For this conventional memory structure, the first layer of poly forms the floating gate. The floating gate covers a portion of a channel region between the source and drain. The remainder of the channel region is directly controlled by a second layer of poly, the control gate, which overlies the floating gate. This overlying control gate couples the gate voltage onto the floating gate and helps pull-up the channel hot electrons. The negative charges injected to the floating gate changes the Vt of the transistor since the trapped electrons change the gate work function; thus requiring additional gate voltage to turn on the device.

Although this conventional floating gate structure works well for many memory devices, it deviates from the conventional (single poly) CMOS process; thus requiring additional process steps as well as increasing process complicity in deposit and removal of the floating gate poly in a small density area among a large processor chip. Also, the floating gate poly presents added equipment costs to maintain compatibility among logic Fabs, for the conventional logic CMOS Fab is equipped with single poly process.

Figure 3A:
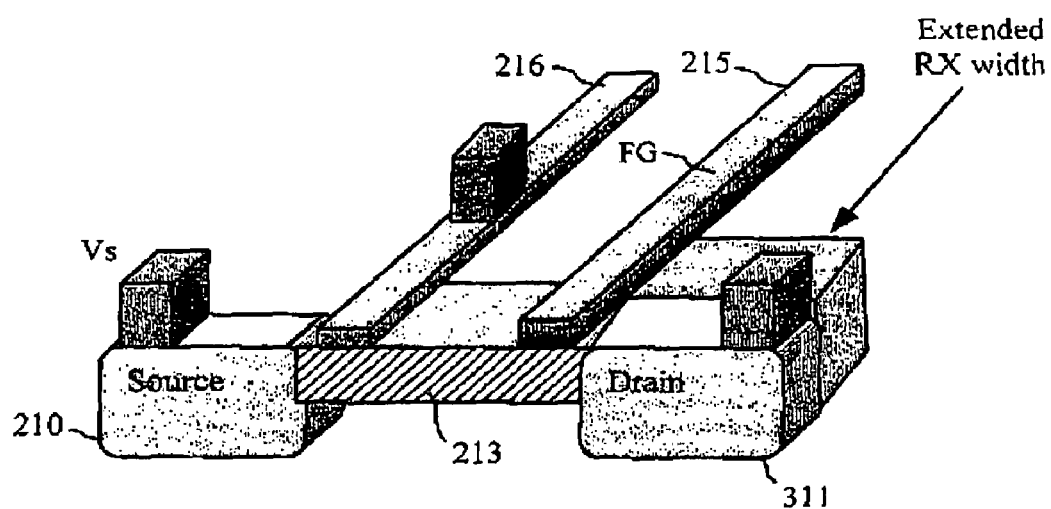
FIG. 3A illustrates another 2-transistor structure for use as an electrical fuse element in accordance with exemplary embodiments of the present invention.
Figure 4A:
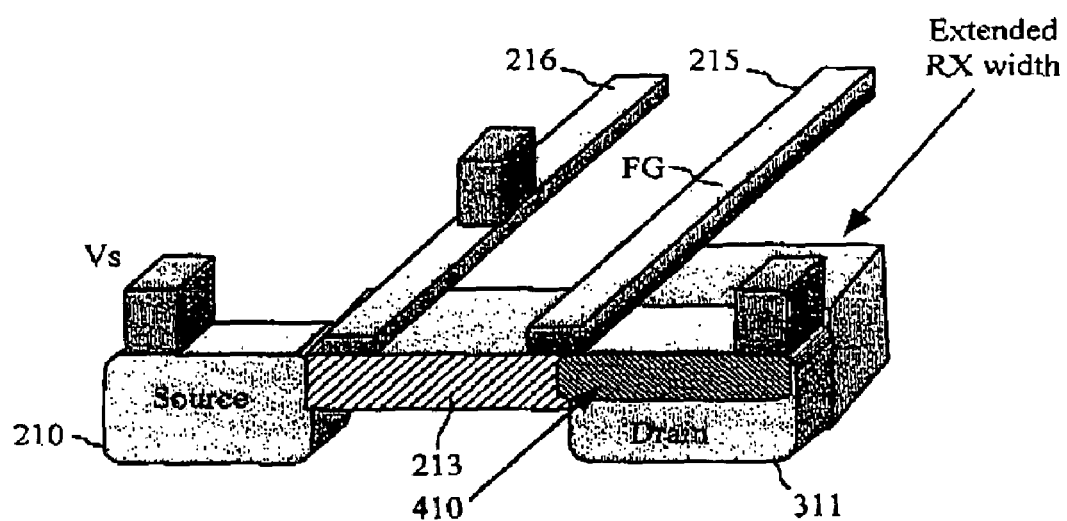
FIG. 4A illustrates still another 2-transistor structure for use as an electrical fuse element in accordance with exemplary embodiments of the present invention.

Referring now to FIGS. 2A, 3A, and 4A there are illustrated 2-transistor structures for use as an electrical fuse element (eFuse) in accordance with exemplary embodiments of the present invention. In each illustrated structure, the control gate and floating gate are implemented in a single-poly process using standard CMOS processing without adding another polysilicon level. Single poly enables the eFuse to be implemented in a host logic process preserving the same process steps maintaining process simplicity and process cost. In addition, the 2-transistor structures of FIGS. 2A, 3A, and 4A operate at a much lower programming voltage because the gate voltage (~5V or below) is enabled to serve to turn on the 2-transistor portion. A vast improvement to the gate bias for programming (~12V) for the structure shown in FIG. 1 and other similar memory devices requiring such a high programming voltage. The typical operating bias for the conventional structure of FIG. 1 is shown in tabular format in FIG. 1B.

Figure 2B:
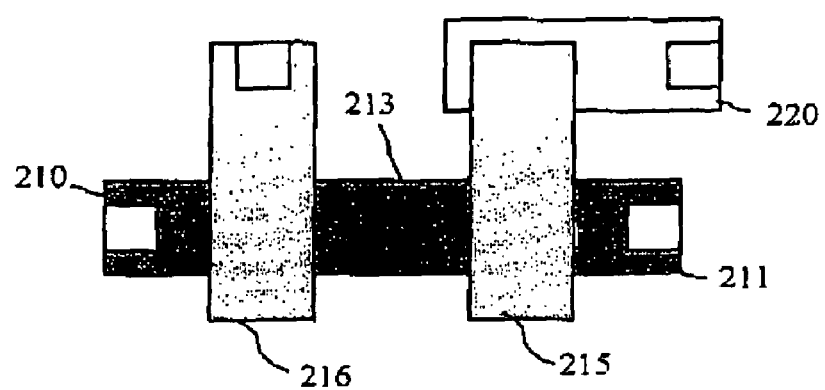
FIG. 2B illustrates a top view of the 2-transistor structure shown in FIG. 2A.

Referring now to FIGS. 2A and 2B, the eFuse 200 includes a source region 210 and drain region 211 of a first conductivity type formed in a semiconductor substrate of a second conductivity type opposite from the first conductivity type in which the source 210 and drain 211 are spaced apart to define a channel region 213 therebetween. Formed over the source region 210, drain region 211 and channel region 213 is a uniform layer of insulating material, on the order of 50 nm. The eFuse 200 further includes a 2-transistor arrangement formed in a single layer of poly. The 2-transistor includes a floating gate portion 215 overlapping a portion of the drain 211 and a control gate portion 216 overlapping a portion of the source 210. The control gate 216 includes a terminal for receiving externally applied voltage potentials for controlling programming and read operations. The floating gate portion 215 and a control gate portion 216 are isolated from one another. Further, an isolated well region 220 can also be formed in the semiconductor substrate. FIG. 2B illustrates a top layout view of the eFuse shown in FIG. 2A. The isolated well 220 is drawn in the semiconductor substrate to overlap only the floating gate portion 215 providing for increased capacitive coupling and reduced programming voltage.

Figures 5A, 5B:
FIG. 5A shows a diagram illustrating programming of the 2-transistor structures illustrated in FIGS. 2A, 3A, and 4A.
FIG. 5B shows biasing for the 2-transistor structures illustrated in FIGS. 2A, 3A, and 4A.

In operation, biasing of the eFuse is achieved through capacitive coupling. That is, the floating gate 215 is independently biased via capacitive coupling with the drain 211 and isolated well 220. The floating gate 215 is charged using programming known as Channel Hot Electron programming. In particular (as is illustrated in FIGS. 5A and 5B), with the source 210 grounded (Vss), threshold voltage (Vt) applied to the gate, and a programming voltage applied to the drain 211, a programming current flows and electrons are provided by source side injection to the floating gate 215 when sufficient energy is gained to jump the silicon energy barrier (~3.1 eV). The isolation well 220 and an extended RX width drain (further discussed below) are designed to provide at least a 70% coupling between the drain 211 and floating gate 215 to enable the lower programming voltage thus, no HV process is needed. With this transistor structure and biasing arrangement, the eFuse programming voltage can be kept below junction breakdown, ranging typically from 3–6V. Exemplary operating bias for the eFuse structures of FIGS. 2A, 3A, and 4A is shown in tabular format in FIG. 5B.

During the Read mode of operation, with the biasing conditions established as described in the table of FIG. 5B, the eFuse exhibits one of two predetermined responses in accordance with charge on the floating gate 215. When the floating gate 215 has been programmed (i.e., charged), it takes more voltage than a predetermined Vref to turn on the floating gate transistor and thus no current will flow from source 210 to drain 211.

In contrast, when the floating gate 215 has not been programmed, Vref is enough to turn on the isolation transistor 11 and the floating gate 12 transistor and current will flow from the source 210 to the bit line (i.e., drain 211). Current flow detection can then be used to determine the programming state.

To erase or reprogram, a negative programming voltage (in this example –5V) is applied to the control gate 216 and hence electrons are channeled away from the floating gate 215.

Figure 3B:
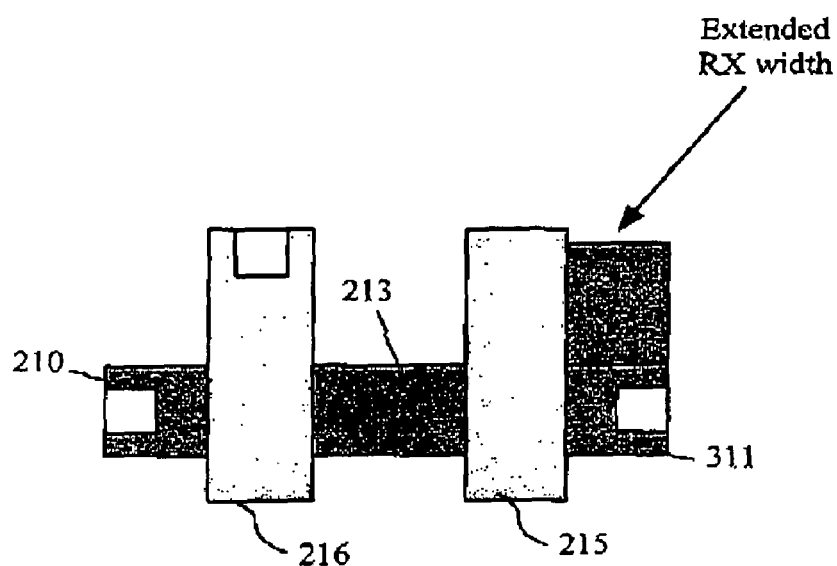
FIG. 3B illustrates a top view of the 2-transistor structure shown in FIG. 3A.
Figure 4B:
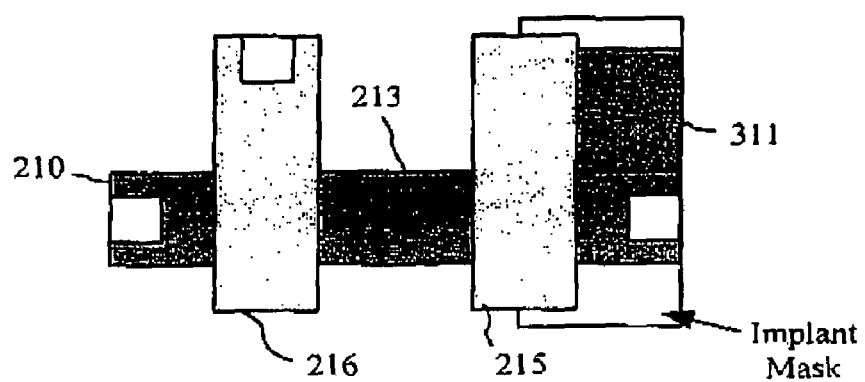
FIG. 4B illustrates a top view of the 2-transistor structure shown in FIG. 4A.

In another embodiment, illustrated in FIGS. 3A and 3B, the drain 311 is drawn with an extended RX width overlapping substantially all the floating gate 215. The extended RX width works the same as the isolated well 220 in that it increases drain-to-floating gate overlap to increase capacitive coupling thus enabling lower programming voltages. In a further embodiment, to increases the coupling efficiency of the drain voltage to the floating gate, the eFuse includes a drive-in implant formed in the semiconductor substrate as shown in FIGS. 4A and 4B. Although the drive-in implant 410 is shown in the extended drain configuration, it can also be used with the isolated well configuration.

Figures 6A, 6B:
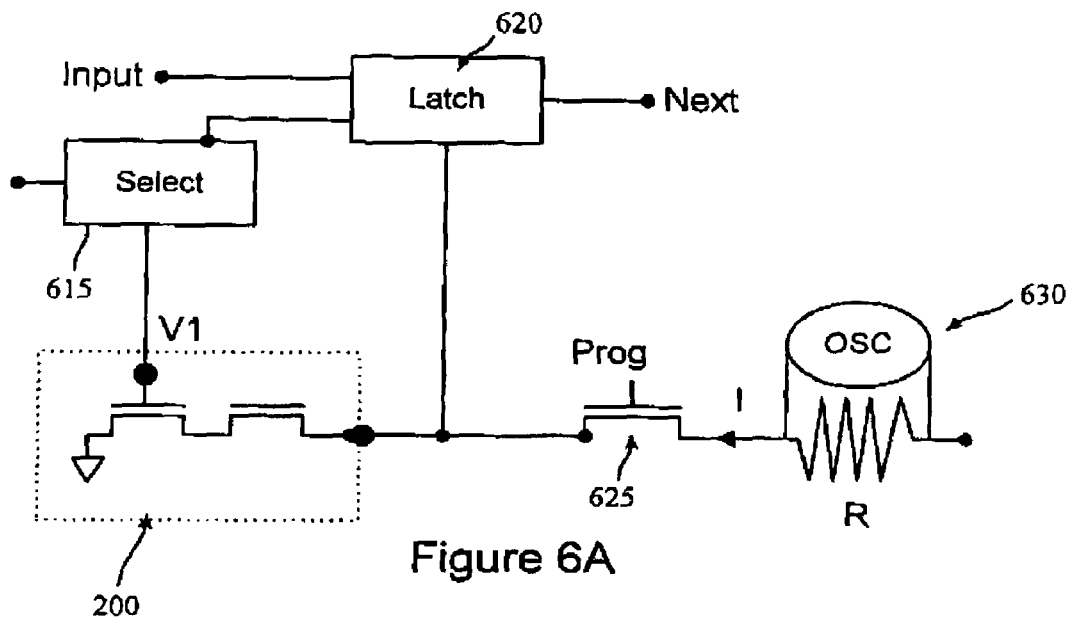
FIG. 6A illustrates a fuse cell in accordance with exemplary embodiments of the present invention.
FIG. 6B shows biasing for the fuse cell illustrated in FIG. 6A.

Referring now to FIG. 6A there is illustrated a fuse cell 610 in accordance with exemplary embodiments of the present invention. The fuse cell 610 includes an eFuse 200, select circuitry 615, latch circuitry 620, a programming transistor (Prog) 625, and a programming current source (OSC) 630. Since Flash programming involves high current injection, a HV source (OSC) 630 is needed to pass the required program current to BL (drain). The OSC 630 is coupled to the drain 211 of the 2-transistor eFuse 200 via Prog 625. Prog 625 is selected ON for programming and selected OFF for reading. The select circuitry 615 is coupled to the control gate 216 of the eFuse 200 for selecting the fuse for programming. Selection of the fuse is thru latch circuitry 620 to BL (drain) and select circuitry 615 to WL (gate). Latch and select circuitry can be connected to a state machine for command. Operation of the fuse cell may be understood by those skilled in the art with reference to the above-mentioned eFuse structure and the biasing conditions shown in FIG. 6B. In particular, for programming, the source 210 is grounded and programming voltage of 5V is applied to the drain 211, 311 or bit line connection with Prog selected ON.

Figure 7A:
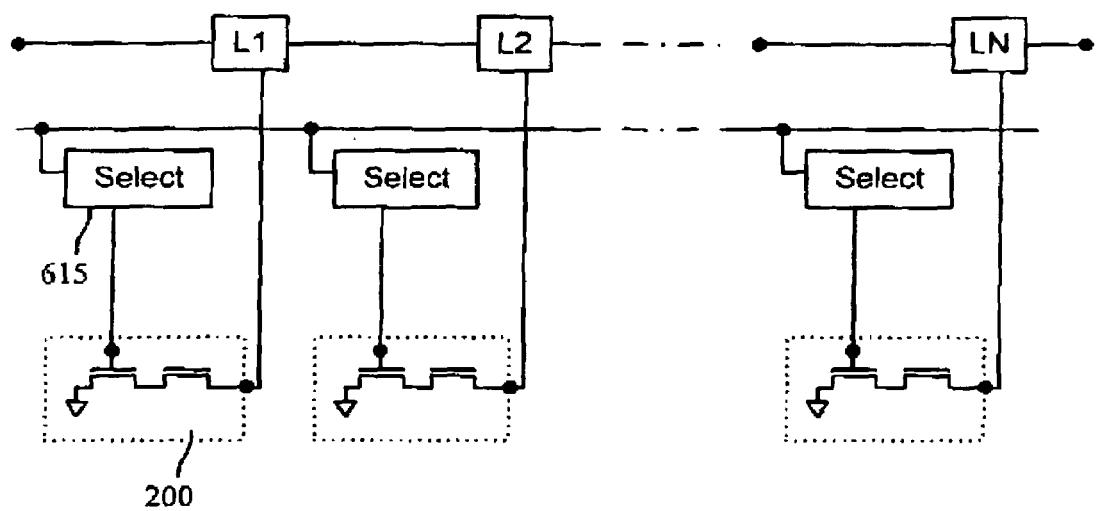
FIG. 7A illustrates a fuse array in accordance with exemplary embodiments of the present invention.

FIG. 7 illustrates an array configuration using the eFuse shown in FIG. 6A in which the select blocks 615 represent the select circuitry 615 of WL in FIG. 6A and the latch blocks L1, L2, . . . LN represent the latch circuitry 620 to respective bit lines. The programming transistor 625 and OSC 630 have been omit for clarity.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. An electrically programmable transistor fuse having a substrate of semiconductor material of a first conductivity type, a source region and drain region disposed in said substrate and spaced apart to define a substantially continuous channel region of monolithic substrate material therebetween, and a layer of insulating material having a uniform thickness and disposed over said source region, drain region and channel region, said electrically programmable transistor fuse comprising:
a first gate and a second gate disposed in a single layer of polysilicon over said insulating material, said first gate disposed overlapping a portion of said source region and said second gate electrically isolated from said first gate and disposed overlapping a portion of said drain region, wherein said first gate includes a terminal for receiving an externally applied signal and said second gate is capacitively coupled to said drain region; and
a coupling device disposed within said substrate and adapted to increase capacitive coupling of said second gate and said drain region, wherein programming is effectuated by charging said second gate via capacitive coupling with said drain region.

2. The fuse of claim 1, wherein said programming is effectuated via application of a voltage signal to said drain region and said voltage signal is less than junction breakdown of said transistor fuse.

3. The fuse of claim 1 further comprising an extended width drain portion integral wit said drain region disposed in said substrate overlapping said second gate for increasing capacitive coupling.

4. The fuse of claim 1 further comprising an extended width drain portion integral with said drain region disposed in said substrate overlapping a portion of said second gate and a well region disposed in said substrate also overlapping a portion of said second gate, wherein said well region is isolated from said second gate and said drain.

5. The fuse of claim 4, wherein programming is effectuated by providing a ground reference to said source, the transistor threshold voltage to said first gate, and a program voltage to said drain region and said isolated well region.

6. The Rise of claim 5, wherein said program voltage is less than the transistor junction breakdown.

7. The fuse of claim 5, wherein reading is effectuated by providing a reference voltage to said first gate and detecting current flow between said source region and said drain region, wherein a programmed state is determined when no current is detected and a non-programmed state is determined when current is detected.

8. The fuse of claim 7, wherein said reference voltage is greater than the transistor threshold voltage.

9. The fuse of claim 5, wherein reprogramming is effectuated by providing the inverse of said programming voltage to said first gate.

10. A programmable fuse cell having a substrate of semiconductor material of a first conductivity type, a source region and drain region disposed in said substrate and spaced apart to define a substantially continuous channel region of monolithic substrate material therebetween, and a layer of insulating material having a uniform thickness and disposed over said source region, drain region and channel region, said programmable fuse cell comprising:
a transistor fuse having:
a first gate and a second gate disposed in a single layer of polysilicon over said insulating material, said first gate disposed overlapping a portion of said source region and said second gate electrically isolated from said first gate and disposed overlapping a portion of said drain region;
said first gate includes a terminal for receiving an externally applied signal and said second gate is capacitively coupled to said drain region; and
a coupling device disposed within said substrate and adapted to increase capacitive coupling of said second gate and said drain region, wherein programming is effectuated by charging said second gate via capacitive coupling with said drain region; and
first circuitry coupled to said first gale terminal and adapted for selecting said transistor fuse for programming via a voltage signal; and
second circuitry coupled with said drain region and said coupling device and adapted for programming and reading the programming state of said transistor fuse.

11. The fuse cell of claim 10, wherein said second circuitry includes a further transistor coupled with said drain region and said coupling device for delivering a programming voltage signal when selected on.

12. The fuse cell of claim 11, wherein said second circuitry includes further circuitry coupled with said transistor fuse for detecting current flow therein when said further transistor is selected off.

13. The fuse cell of claim 10, wherein said programming is effectuated via application of a voltage signal to said drain region and said coupling device which is less than junction breakdown of said transistor fuse.

14. The fuse cell of claim 10, wherein said transistor fuse further comprises an extended width drain portion integral with said drain region disposed in said substrate overlapping said second gate for increasing capacitive coupling.

15. The fuse cell of claim 10, wherein said transistor fuse further comprises an extended width drain portion integral with said drain region disposed in said substrate overlapping a portion of said second gate and a well region disposed in said substrate also overlapping a portion of said second gate, wherein said well region is isolated from said second gate and said drain.

16. The fuse cell of claim 10, wherein programming is effectuated by providing a ground reference to said source, the transistor threshold voltage to said first gate via said first circuitry, and a programming voltage to said drain region via said second circuitry.

17. The fuse cell of claim 16, wherein said program voltage is less than the transistor junction breakdown.

18. The fuse cell of claim 16, wherein reading is effectuated by providing a reference voltage to said first gate via said first circuitry and detecting current flow between said source region and said drain region via said second circuitry, wherein a programmed state is determined when no current is detected and a non-programmed state is determined when current is detected.

19. The fuse cell of claim 18, wherein said reference voltage is greater than the transistor threshold voltage.

20. The fuse cell of claim 16, wherein reprogramming is effectuated by providing a voltage of opposite polarity to the programming voltage to said first gate via said first circuitry.

* * * * *

UNITED STATES PATENT AND TRADEMARK OFFICE
CERTIFICATE OF CORRECTION

PATENT NO. : 7,075,127 B2 Page 1 of 1
APPLICATION NO. : 10/769101
DATED : July 11, 2006
INVENTOR(S) : Chandrasekharan Kothandaraman et al.

It is certified that error appears in the above-identified patent and that said Letters Patent is hereby corrected as shown below:

Column 6, in claim 3, line 2, after "portion integral" delete "wit" and substitute --with-- in its place.

Column 6, in claim 6, line 1, delete "Rise" and substitute --fuse-- in its place.

Column 6, in claim 10, line 24, before "terminal and" delete "gale" and substitute --gate-- in its place.

Signed and Sealed this

Twenty-seventh Day of March, 2007

JON W. DUDAS
*Director of the United States Patent and Trademark Office*